United States Patent [19]

Deiss

[11] 4,264,977
[45] Apr. 28, 1981

[54] SEARCH TYPE TUNING SYSTEM

[75] Inventor: Michael S. Deiss, Indianapolis, Ind.

[73] Assignee: RCA Corporation, New York, N.Y.

[21] Appl. No.: 70,704

[22] Filed: Aug. 29, 1979

[51] Int. Cl.³ .......................... H04B 1/16; H04N 5/44
[52] U.S. Cl. ..................................... 455/182; 455/183
[58] Field of Search ............... 455/160, 164, 165, 182, 455/183; 358/191.1, 193.1, 195.1

[56] References Cited

U.S. PATENT DOCUMENTS

| | | | |
|---|---|---|---|
| 4,031,549 | 6/1977 | Rast | 455/182 |
| 4,041,535 | 8/1977 | Rzeszewski et al. | 455/183 |
| 4,077,008 | 2/1978 | Rast et al. | 455/183 |
| 4,109,283 | 8/1978 | Rast | 455/183 |

OTHER PUBLICATIONS

"Dics–Digital Tuning System For TV Receivers" by N.V. Philips' Gloeilampenfabrieken, Netherlands, 2/1977.

*Primary Examiner*—Jin F. Ng
*Attorney, Agent, or Firm*—E. M. Whitacre; P. J. Rasmussen; P. M. Emanuel

[57] ABSTRACT

A tuning system for a television receiver includes a phase locked loop (PLL) configuration and an automatic fine tuning (AFT) configuration which are selectively enabled to operate to tune the receiver to nonstandard as well as standard frequency RF carriers which may be provided by cable and master antenna systems. After the selection of a new channel, the operations of the PLL and AFT configurations are sequentially enabled by a mode control apparatus. During the operation of the AFT configuration, an offset detector determines when the frequency of the local oscillator signal is caused to be more than a predetermined offset from its value established during the previous operation of the PLL configuration. In response, the mode control unit reestablishes the operation of the PLL configuration. Channel selection apparatus causes a new channel to be selected after a predetermined number of alternate operating cycles of the two configurations.

5 Claims, 2 Drawing Figures

SEARCH TYPE TUNING SYSTEM

BACKGROUND OF THE PRESENT INVENTION

The present invention relates to search type tuning systems.

A wide variety of "search" or "signal seeking" tuning systems for radio and television receivers are known which provide for automatically tuning only those channels which have acceptable reception characteristics and for skipping past those channels which have unacceptable reception characteristics. Such tuning systems typically include a number of signal detectors for determining when a received RF carrier has acceptable reception characteristics. For example, a search type tuning system for a television receiver may include: an AFT (automatic fine tuning) detector for determining when an IF carrier derived from the received RF carrier has a frequency within a predetermined range of its desired value; and AGC (automatic gain control) detector for determining when the received RF carrier has an amplitude greater than a predetermined value; and a synchronization detector to determine when synchronization pulses derived from the received RF carrier have the proper frequency.

Tuning systems are also known which include a memory having memory locations associated with each channel in a tuning range for storing information as to whether the associated station or channel is preferred or not. Such "memory" type tuning systems may be utilized as an alternative to the "search" type tuning systems to select only those channels with acceptable reception characteristics in a given location.

Both "search" and "memory" type tuning systems require a considerable amount of complex and expensive circuitry, in addition to the basic tuning system for tuning each channel in a tuning range, for tuning only those channels with acceptable reception characteristics. Thus, there is a need for a tuning system which requires only a relatively small amount of circuitry in addition to the basic tuning system for tuning only channels with acceptable reception characteristics.

SUMMARY OF THE PRESENT INVENTION

The present invention is an improvement to the type of electronic tuning system which includes first tuning means for tuning a tuner to standard frequencies associated with respective channels, second tuning means for tuning the tuner to reduce deviations between the frequency of an IF carrier generated by the tuner and its desired or nominal value that may arise due to, e.g., offsets in the frequencies of received RF carriers, and mode switching means for selectively applying the first and second tuning control signals to the tuner. In this type of electronic tuning system, the operation of the first tuning means is enabled after a new channel is selected and the operation of the second tuning means is enabled after the first tuning means has completed its operation. During the operation of the second tuning means, an offset detector determines when the frequency of a local oscillator signal generated by the tuner becomes offset from value established during the operation of the first tuning means and causes the operation of the first tuning means to again be enabled.

In accordance with the present invention, search means are provided in the above described type of electronic tuning system for causing a new channel to be selected if no RF carrier is tuned by the end of a predetermined number of operating cycles of the second tuning means.

DETAILED DESCRIPTION OF THE DRAWING

Figure 1:
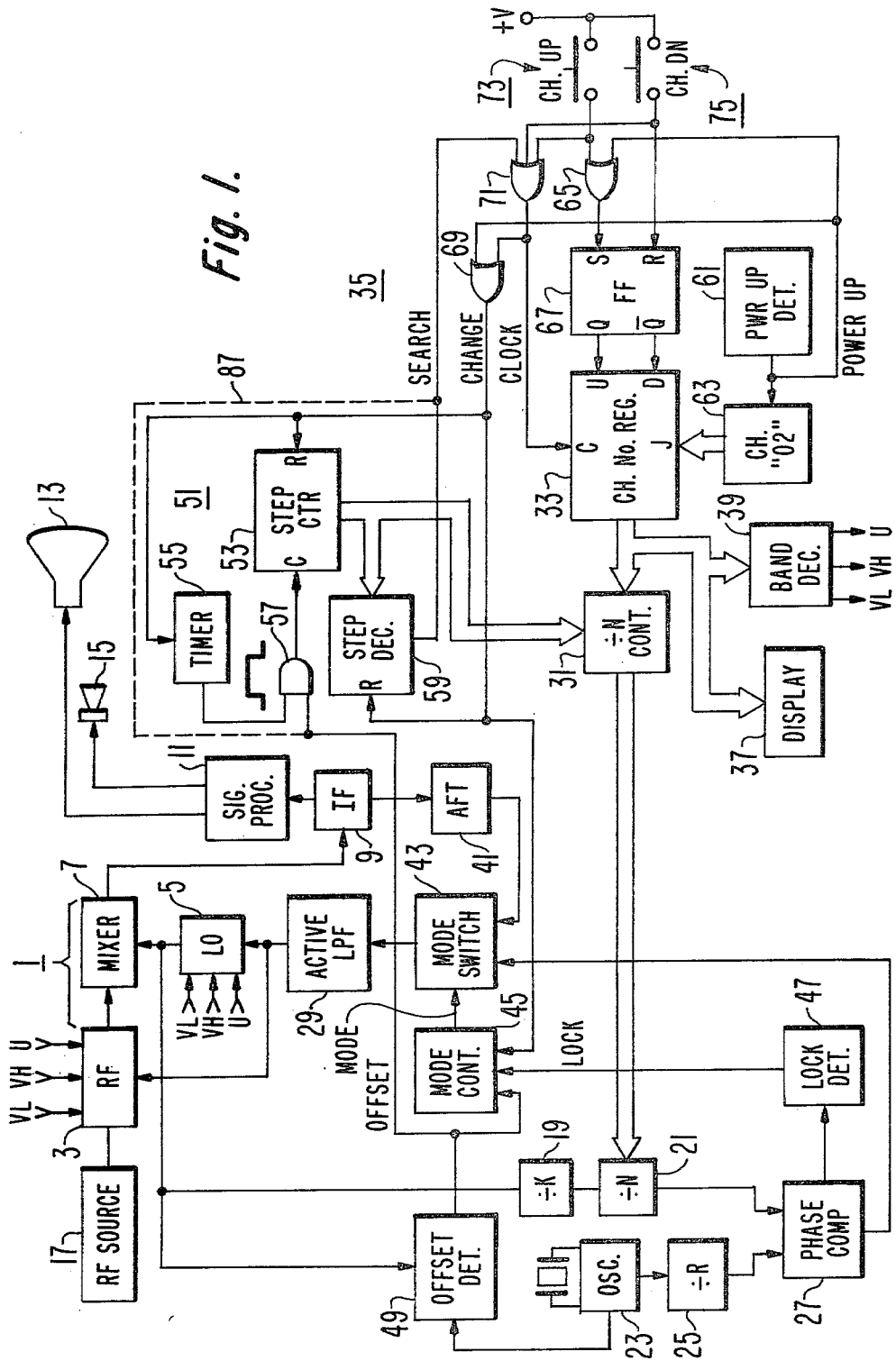
FIG. 1 shows in block diagram form a television receiver including a tuning system incorporating the present invention.

A television receiver shown in FIG. 1 includes a tuner 1 comprising an RF unit 3, a voltage controlled local oscillator (VCLO) 5 and a mixer 7 for heterodyning an RF signal provided by RF unit 3 and a local oscillator signal provided by VCLO 5 to generate an IF signal having picture and sound carriers. An IF signal processing unit 9 filters and amplifies the IF signal. A baseband signal processing unit 11, a picture tube 13 and a speaker 15 develop visual and audible responses from respective IF signal components. RF signals are applied to tuner 1 through an RF signal source 17 which may, e.g., be a master antenna or cable installation. Since such installations are not as strictly regulated by the Federal Communications Commission (FCC) as broadcast stations, the RF signals they provide may have nonstandard frequency carriers which are offset in frequency with respect to respective standard frequency carriers transmitted by broadcast stations.

The tuning system which constitutes the remaining portion of the television receiver shown in FIG. 1 generates tuning control voltages for controlling the frequency of the local oscillator signal generated by VCLO 5 and the frequency response of RF unit 3 so that the receiver can be tuned to nonstandard as well as standard frequency RF carriers. The tuning system included is generally of the same type as is disclosed in U.S. Pat. No. 4,031,549, hereby incorporated by reference. The tuning system includes: a phase locked loop (PLL) configuration for generating a first tuning control voltage for causing RF unit 3 and VCLO 5 to be tuned to standard frequencies corresponding to the standard frequency RF broadcast carriers associated with selected channels; an AFT configuration for generating a second tuning control voltage for causing RF unit 3 and VCLO 5 to be tuned so as to reduce deviations between the frequency of the picture carrier of the IF signal and its desired or nominal value, e.g., in the U.S., 45.75 MHz, which may occur due to the reception of nonstandard frequency RF carriers; and a mode selection apparatus for selectively causing the first and second tuning control voltages to be applied to tuner 1.

The PLL configuration includes: a fixed frequency divider ($\div K$) 19 and a programmable frequency divider ($\div N$) 21 for dividing the frequency of the local oscillator signal generated by VCLO 5 to derive a frequency-divided version of the local oscillator signal; a crystal oscillator 23; a fixed frequency divider ($\div R$) 25 for dividing the frequency of the output signal of a crystal oscillator 23 to generate a frequency reference signal; and a phase comparator 27 for generating pulse error signals having polarities and durations respectively representing the sense and magnitude of the phase and/or frequency deviation between the frequency-divided local oscillator signal and the frequency reference signal.

The error pulses are selectively applied to an active low pass filter (LPF) or integrator 29 by the mode selection apparatus to be described below. In response to the error pulses, LPF 29 generates the first tuning control voltage for tuner 1. The operation of the PLL configuration is enabled when the error pulse are applied to LPF 29. During the operation of the PLL configuration, the magnitude of the first tuning control voltage changes in accordance with the phase and/or frequency deviation between the frequency-divided local oscillator signal and the frequency reference signal to reduce the deviation. When the deviation has been minimized, the frequency of the local oscillator signal, $f_{LO}$, will have a programmed value related to the frequency of the crystal oscillator signal, $f_{XTAL}$, by the following expression:

$$f_{LO} = N \frac{K}{R} f_{XTAL}$$

The division factors K and R are selected to determine the operating frequency range of the PLL configuration. Desirably, the factor $$\frac{K}{R} f_{XTAL}$$

is made equal to 1 MHz, so that the programmable division factor of divider 21, N, is equal, in MHz, to the frequency of the local oscillator signal.

The value of N is controlled by a control unit 31 in response to binary signals representing in coded format the channel number of the selected channel which are generated by and stored in a channel number register 33 under the control of a channel selection arrangement generally indicated by reference number 35. The binary stored in channel number register 33 are also applied to a channel number display unit 37 and a band decoder 39. Band decoder 39 determines the frequency band in which the selected channel resides from the binary signals representing the channel number of the selected channel. Band decoder 39 generates a VL signal when the selected channel is in the low VHF band, i.e., channels 2-6; a VH signal when the selected channel is in the high VHF band, i.e., channels 7-13; and a U signal when the selected channel is in the UHF band, i.e., channels 14-83. The VL, VH and U signals control the selection of respective inductors (not shown) of tuned circuits (not shown) of RF unit 3 and VCLO 5 to control the tuning range of the tuned circuits. Each tuned circuit includes a voltage variable capacitance or varactor diode which determines the center frequency of the tuned circuit in response to the first and second tuning control voltages.

The AFT configuration includes an AFT discriminator 41 of the conventional type for generating an AFT signal having a generally s-shaped amplitude versus frequency characteristic representing the magnitude and sense of deviation of the frequency of the IF picture carrier from its desired or nominal value, e.g., 45.75 MHz. The AFT signal is selectively applied to LPF 29 by the mode selection apparatus. In response, LPF 29 generates the second tuning control voltage. The operation of the AFT configuration is enabled when the AFT signal is applied to LPF 29. During the operation of the AFT configuration, the frequency of the local oscillator signal is adjusted from its standard value for the selected channel to correct for any deviations of the frequency of the IF picture carrier from 45.75 MHz due to corresponding offsets of the frequency of the received RF carrier.

The mode switching apparatus includes a mode switch 43 which may comprise a double throw, signal pole electronic switching device and a mode control unit 45 for controlling the "position" of mode switch 43. Mode control unit 45 includes: a flip flop (not specifically shown) for generting a MODE control signal having a first logic level for causing mode switch 43 to apply the error pulses generated by phase comparator 27 to LPF 29 and a second logic level for causing mode switch 43 to apply the AFT signal generated by discriminator 4 to LPF 29; and combinational logic (not specifically shown) for controlling the state of the flip flop in response to signals generated by channel selection arrangement 35 a lock detector 47 and an offset detector 49.

When a new channel is selected, as will be described below, channel selection arrangement 35 generates a CHANGE pulse. In response to the CHANGE pulse, the MODE control signal is set to its first level. In response to the first level, which will hereinafter be referred to as the PLL enable level, mode switch 43 applies the error signal generated by phase comparator 29 to LPF 29 and thereby enables the operation of the PLL configuration. When the deviation between the frequency divided local oscillator signal and frequency reference signal has been substantially minimized, the pulses of the error signal generated by phase comparator 27 will have relatively short durations. This occurrence is detected by a lock detector 47 which responds by generating a LOCK signal. In response to the LOCK signal, the MODE control signal is set to its second level. In response to the second level, which will hereinafter be referred to as the AFT ENABLE level, mode switch 43 applies the AFT signal generated by discriminator 41 to LPF 29 and thereby enables the operator of the AFT configuration.

At any time after the initiation of the arrangement, should the frequency of the local oscillator signal be offset from the value established during the operation of the PLL configuration by a predetermined amount, e.g., 1.25 MHz, offset detector 49 detects the occurrence and generates on OFFSET signal. In response to the OFFSET signal, the MODE control signal is reset to its PLL level thereby terminating the operation of the AFT configuration and reestablishing the operation of the PLL configuration. Local oscillator frequency offsets greater than 1.25 MHz are to be avoided since such offsets approach the 1.5 MHz separation between the frequency of the picture carrier of the present channel and the frequency of the sound carrier of the lower adjacent channel.

Since certain cable and master antenna installations provide nonstandard frequency RF carriers offset in frequency from respective standard frequency carriers by as much as ±2.5 MHz and since conventional AFT discriminators which may be employed as AFT discriminator 41 are not typically capable of generating an AFT signal for reliably correcting deviations between the frequency of the IF picture carrier and 45.75 MHz as large as ±2.5 MHz, the tuning system includes a "stepping" arrangement 51 for incrementally changing the value of N in response to the OFFSET signal when the operation of the PLL configuration is reinitiated.

Specifically, in response to the first generation of the OFFSET signal during the first AFT operating cycle after a new channel is selected, a step counter 53, coupled to ÷N control unit 31, is set to a predetermined state which causes the value of N to be increased by 1 with respect to the standard value for the selected channels and the operation of the PLL configuration is reinitiated. Accordingly, the frequency of the local oscillator signal is increased by 1 MHz with respect to the standard frequency for the selected channel. Thereafter, when the LOCK signal is again generated, the operation of the AFT configuration is initiated for the second time. In this manner, the tuning system is capable of locating and tuning nonstandard frequency carriers which may be offset from respective standard frequency carriers by as much as +2.25 MHz (i.e., 1+1.25 MHz).

If no RF carrier is located for the increased value of N, a second OFFSET signal will be generated during the second AFT operating cycle when the frequency of the local oscillator signal is caused to be more than 1.25 MHz from the value established previously under the control of the PLL configuration. In response to the second generation of the OFFSET signal, step counter 53 is set to a state causing the value of N to be decreased by 1 with respect to its standard value for the selected channel and the operation of the PLL configuration is again reinitiated. Accordingly, the frequency of the local oscillator signal is increased by 1 MHz with respect to the standard frequency for the selected channel. Thereafter, when the LOCK signal is again generated, the operation of the AFT configuration is initiated for the third time. In this manner, the tuning system is capable of locating and tuning nonstandard frequency carriers which may be offset from respective standard frequency carriers by as much as −2.25 MHz (i.e., −1−1.25 MHz).

Thus, by first increasing and then decreasing the value of N the tuning system is capable of locating and tuning an RF carrier having a frequency within a range of ±2.25 MHz of the standard frequency for the selected channel. It is noted that, the value of N is first increased rather than first decreased to reduce the possibility of tuning the sound carrier of the lower adjacent channel. While in the embodiment of FIG. 1, the increments of N are equal to 1, other increments less than the difference between values of N for adjacent channels may be utilized.

The reception of an RF carrier may be temporarily interrupted, e.g., when an airplane passes over the reception area. When the RF carrier is again recived, it is desirable that the value of N be the same as it was before the reception was interrupted. A timer 55 and and AND gate 57 are provided for this purpose. Specifically, in response to the generation of a CHANGE pulse when a new channel is selected, timer 55, which may comprise a monostable multivibrator, generates a positive going pulse having a duration longer than the time required to complete the three alternate operating cycles of the PLL configuration and the AFT arrangement. The positive going pulse enables AND gate 57 to apply the OFFSET signal to the clock (C) input of step counter 53. After the positive-going pulse terminates, AND gate 57 is disabled from applying the OFFSET signal to step counter 53. As a result once an RF carrier has been located and tuned, the value of N is maintained.

In the present tuning system, if no RF carrier is located for a selected channel, channel selection arrangement 35 (including elements 33, 61, 63, 65, 67, 69, 71, 73 and 75) causes the selection of the next channel in sequence. More specifically, a step decoder 59 determines when the OFFSET signal is generated for the third time during the third operational cycle of the AFT arrangement by examining the state of step counter 53 (as will be explained in more detail with reference to FIG. 2) and, in response, generates a high logic level SEARCH signal. The SEARCH signal is applied to channel selector arrangement 35 to cause the contents of channel number register to be increased to the value corresponding to the next higher channel number as will now be described.

Channel number register 33 comprises a presettable up/down counter with "jam" inputs, such as the CD 4029 integrated circuit available from RCA Corporation, Somerville, N.J., (not specifically shown) for each of the two digits of the channel number. When the receiver is turned on, a power up detector 61 determines when a supply voltage generated by the receiver's power supply (not specifically shown) attains a predetermined threshold level and, in response to this occurrence, generates a positive-going POWER UP pulse. The POWER UP pulse causes binary signals representing channel number 02, i.e., the lowest channel number, developed by means of appropriate connections to sources of voltages corresponding to the high and low logic levels within a logic array 63 to applied to the "jam" (J) inputs of the up/down counters of channel number register 33. In addition, the POWER UP pulse is applied via an OR gate 65 to the set (S) input of a set reset flip flop (FF) 67 causing the latter to be set. In response to the resulting development of a high logic level of the Q output of FF 67, channel number register 33 is enabled to count in increasing order. The POWER UP pulse also causes an OR gate 69 to generate a CHANGE pulse. As a result, the operation of the PLL configuration is initiated with the value of N set to the standard value associated with channel number 02.

If no RF carrier has been located and tuned by the third operational cycle of the AFT arrangement, as earlier noted, an OFFSET signal will be generated during the third AFT operational cycle when N has a value 1 less than the standard value. In response, step counter 53 will be set to its initial state, i.e., the state corresponding to the standard value of N. Step decoder 59 detects this occurrence and generates a positive-going SEARCH pulse. In response to the positive-going SEARCH pulse, an OR gate 71 generates a positive-going CLOCK signal and OR gate 69 generates a CHANGE pulse. The CLOCK pulse is applied to the clock (C) input of channel number register 33 and thereby causes its contents to be increased to a value corresponding to the next higher channel number, i.e., channel 03. Thereafter, the above described operation is repeated for channel number 03 and for successive higher channel numbers until a RF carrier is located and tuned.

After the receiver is tuned on and the first RF carrier has been located and tuned in the aforesaid manner, a new higher channel may be selected by a user by momentary depression of a CH. UP (channel up) pushbutton 73 and a new lower channel may be selected by momentary depression of a CH. DN (channel down) pushbutton 75. The depression of pushbutton 73 causes its normally opened contacts to be closed thereby applying a positive voltage +V corresponding to the high logic level to OR gate 65. As a result, a high logic level is applied to the set (S) input of FF 67 and channel number register 33 is enabled to count in increasing channel number order. The depression of pushbutton 75 causes its normally opened contacts to be closed thereby applying voltage +V to the reset (R) input of FF 67. As a result, FF 67 is reset and channel number register 33 is enabled to count in decreasing channel number order. In addition, when either of pushbuttons 73 or 75 is depressed, OR gate 71 generates a CLOCK signal which causes the contents of channel number register 33 to be changed to the next channel number in the order selected and OR gate 69 generates a CHANGE signal thereby initiating the operation of the PLL configuration with the standard value of N for the new channel number. Thereafter, the search operation as described above occurs in the order determined by the state of FF 67 until an RF carrier located and tuned.

Figure 2:
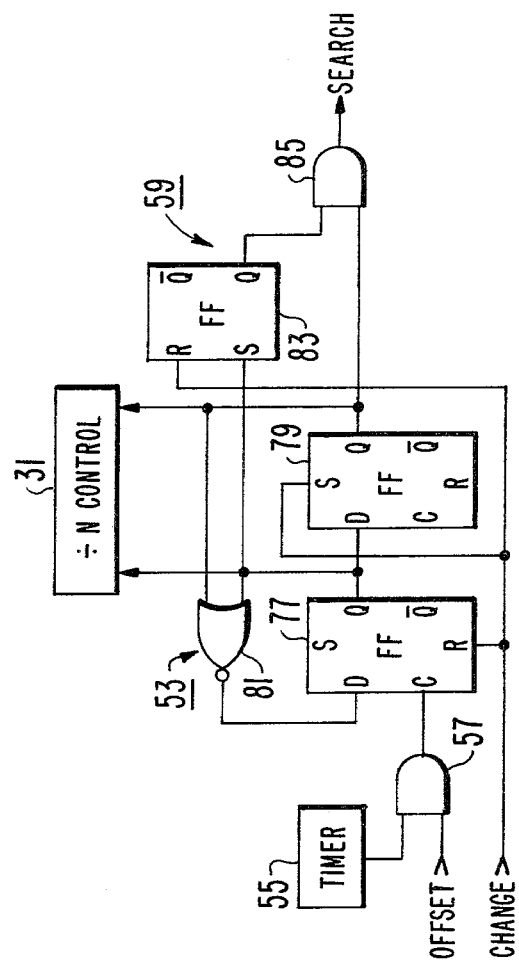
FIG. 2 shows in logic diagram from an implementation of a portion of the tuning system of FIG. 1.

Logic implementations of step counter 53 and step decoder 59 are shown in FIG. 2 in which portions also shown in FIG. 1 have the same reference numbers. Step counter 53 includes D (data) flip flops 77 and 79 and a NOR gate configured as shown to cyclically count through three states in response to successive generations of the OFFSET signal. The table below lists the states in the order they are generated and the incremental change in N to which they correspond.

| STATE | Q OUTPUT OF FF 77 | Q OUTPUT OF FF 79 | INCREMENT |
| --- | --- | --- | --- |
| 1 | 0 | 1 | 0 |
| 2 | 0 | 0 | +1 |
| 3 | 1 | 0 | −1 |

Step counter 53 is set to state 1 in response to the CHANGE pulse.

Step decoder 59 includes a S-R (set-reset) FF 83 and an AND gate 85 configured as shown to generate a positive-going SEARCH pulse when the Q output of FF 79 attains the high logic level after the Q output of FF 77 has attained the high logic level, i.e., in response to the third generation of the OFFSET signal. FF 79 of decoder 55 is reset in response to the CHANGE pulse.

Programmable divider 21 includes counters and comparators (not specifically shown). The comparators determine when N periods of the output signal of fixed divider 19 have occurred. Control unit 31, which may include a ROM (read only memory), sets the value to which the comparators compare the contents of the counters. In response to the Q output signals of FFs 77 and 79, the value of control unit 31 augments the comparison values for the standard value of N.

Various portions of the tuning system that has been described (except for the portions having to do with the generation and use of the SEARCH signal) may be implemented in the manner disclosed in the aforementioned U.S. Pat. No. 4,109,283 which has been incorporated by reference.

Thus, there has been described a tuning system of the type in which PLL and AFT configurations are selectively enabled to control a tuner for tuning standare and nonstandard frequency RF carriers in which dual use is advantageously made of a signal manifesting the selective operation of the configurations to cause a new channel to be selected if an RF carrier is not located for a previously selected channel by the end of a predetermined number of alternate operating cycles of the two configurtions. In addition, in the described tuning system, dual use is also advantageously made of a counting arrangement for counting the number of times the operation of the AFT configuration is terminated to determine the programmed frequency to be established by the PLL configuration during operating cycles of the PLL configuration following operating cycles of the AFT configuration to determine when a new channel should be selected.

While the tuning system of FIG. 1 includes provisions, specifically, increment control unit 51, for handling nonstandard frequency RF carriers which are offset from respective standard frequency carriers by more than the fine tuning range of conventional AFT discriminators, such provisions may be omitted where the offsets are not so large. In this case, the OFFSET signal may be directly empoyed as the SEARCH signal by applying the OFFSET signal to OR gate 71 as is indicated by phantom conductor 87. With this configuration, a new channel will be selected after the first generation of the OFFSET signal. In addition, other signals manifesting the termination of the AFT operating mode, such as the MODE control signal generated by mode control unit 45, may be employed to cause the contents of channel number register 33 to be changed until an RF carrier is located and tuned. These and other modifications are intended to be within the scope of the present invention as defined by the following claims.

What we claim is:

1. Apparatus for selectively tuning a receiver to any one of a plurality of RF carriers associated with respective channels, comprising:

local oscillator means for generating a local oscillator signal;

mixer means for combining a selected one of said RF carriers with said local oscillator signal to derive an IF signal having at least one carrier with a nominal frequency value;

phase locked loop (PLL) means for selectively controlling said local oscillator means when enabled to operate to cause said local oscillator signal to have a programmed frequency substantially equal to the product of a programmable factor and the frequency of a frequency reference signal;

programmable factor control means for determining programmable factor in accordance with the channel selected and for generating a CHANGE signal when a new channel is selected;

lock means for generating a LOCK signal when said local oscillator signal has a frequency substantially equal to said programmed frequency;

automatic fine tuning (AFT) means for selectively controlling said local oscillator means when enabled to operate to reduce a deviation between the actual frequency of said IF carrier and said nominal frequency value;

offset detector means for generating an OFFSET signal when the frequency of said local oscillator signal is caused to be offset from said programmed frequency by a predetermined amount during the operation of said AFT means;

mode control means for enabling the operation of said PLL means in response to said CHANGE signal, for enabling the operation of said AFT means in response to said LOCK signal and for again enabling the operation of said PLL means in response to said OFFSET signal; and channel selection means for causing said programmable factor control means to select the programmable factor associated with the next channel when said OFFSET signal is generated a predetermined number of times.

2. The apparatus recited in claim 1 wherein:
said predetermined number of times is equal to one.

3. The apparatus recited in claim 1 wherein:
said programmable factor control means is coupled to counter means for counting the number of times said OFFSET signal is generated to change said programmable factor by an increment less than the difference between programmable factors associated with respective adjacent channels when said OFFSET signal is generated a second predetermined number of times less than said first mentioned predetermined number of times; and said channel selection means is also coupled to said counter means for causing said programmable factor control means to select the programmable factor associated with the next channel when said OFFSET signal is generated said first mentioned predetermined number of times.

4. The apparatus recited in claim 3 wherein:
said programmable factor control means increases said programmable factor by said increment in response to a first generation of said OFFSET signal and decreases said programmable factor by said increment in response to a second generation of said OFFSET signal and changes said programmable factor to the value associated with the next channel in response to a third generation of said OFFSET signal.

5. The apparatus recited in claim 4 wherein:
said programmable factor control means includes inhibiting means for inhibiting said programmable factor control means from changing said programmable factor to the value in response to said OFFSET signal after a predetermined time longer than the time required to tune said receiver to a selected channel.

* * * * *